United States Patent
Shih

(10) Patent No.: US 10,403,820 B1
(45) Date of Patent: Sep. 3, 2019

(54) METHOD FOR CONTINUOUSLY PREPARING ORGANIC LIGHT EMITTING DIODE BY USING THERMAL TRANSFER FILM

(71) Applicant: CHIEN HWA COATING TECHNOLOGY, INC., Hsinchu (TW)

(72) Inventor: Hung-Hsin Shih, Taipei (TW)

(73) Assignee: Chien-Hwa Coating Technology, Inc., Hsinchu (TW)

( * ) Notice: Subject to any disclaimer, the term of this patent is extended or adjusted under 35 U.S.C. 154(b) by 0 days.

(21) Appl. No.: 15/991,246

(22) Filed: May 29, 2018

(30) Foreign Application Priority Data

Mar. 31, 2018 (TW) .............................. 107111528 A

(51) Int. Cl.
*H01L 51/00* (2006.01)
*H01L 51/50* (2006.01)
*H01L 51/52* (2006.01)
*H01L 51/56* (2006.01)

(52) U.S. Cl.
CPC ...... *H01L 51/0013* (2013.01); *H01L 51/0026* (2013.01); *H01L 51/5012* (2013.01); *H01L 51/5056* (2013.01); *H01L 51/5072* (2013.01); *H01L 51/5092* (2013.01); *H01L 51/5206* (2013.01); *H01L 51/529* (2013.01); *H01L 51/5221* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 6,114,088 A * | 9/2000 | Wolk | B41M 3/006 346/135.1 |
| 6,214,151 B1 * | 4/2001 | Chen | B41M 5/265 156/230 |
| 6,291,116 B1 * | 9/2001 | Wolk | B41M 3/006 313/604 |
| 6,855,384 B1 * | 2/2005 | Nirmal | B41M 5/38207 156/235 |
| 7,371,605 B2 * | 5/2008 | Katz | H01L 51/0013 438/780 |
| 8,466,484 B2 * | 6/2013 | Van Slyke | H01L 51/0013 257/98 |
| 9,455,406 B1 * | 9/2016 | Fang | H01L 51/0026 |
| 9,741,972 B2 * | 8/2017 | Wu | H01L 51/56 |
| 2003/0045021 A1 * | 3/2003 | Akai | H01L 51/0013 438/99 |
| 2004/0206307 A1 * | 10/2004 | Boroson | C23C 14/28 118/719 |
| 2005/0145326 A1 * | 7/2005 | Hatwar | H01L 51/0013 156/230 |
| 2006/0188697 A1 * | 8/2006 | Lee | H01L 51/0013 428/156 |

(Continued)

*Primary Examiner* — Andres Munoz
(74) *Attorney, Agent, or Firm* — Winston Hsu

(57) ABSTRACT

A method for continuously preparing organic light emitting diode (OLED) by using thermal transfer film is revealed. At least two thermal transfer layers are transferred onto a substrate in turn by thermal transfer printing for overcoming shortcomings of the conventional vacuum evaporation including complicated processes and low material efficiency. Only less than 50% material reaches the substrate after the vacuum evaporation.

20 Claims, 12 Drawing Sheets

(56) References Cited

U.S. PATENT DOCUMENTS

| | | | |
|---|---|---|---|
| 2006/0216910 A1* | 9/2006 | Katz | H01L 51/0013 438/458 |
| 2006/0233950 A1* | 10/2006 | Kim | H01L 51/0013 427/148 |
| 2008/0014528 A1* | 1/2008 | Bailey | B41M 3/006 430/200 |
| 2017/0297356 A1* | 10/2017 | Fukunaga | B41M 5/392 |

* cited by examiner

METHOD FOR CONTINUOUSLY PREPARING ORGANIC LIGHT EMITTING DIODE BY USING THERMAL TRANSFER FILM

BACKGROUND OF THE INVENTION

Field of the Invention

The present invention relates to a method for preparing Organic Light Emitting Diode (OLED), especially to a method for continuously preparing organic light emitting diode (OLED) by using thermal transfer film.

Description of Related Art

A semiconductor is a kind of material whose electrical conductivity value falls between that of an insulator and a conductor. The semiconductor has a profound impact on either technology or economic development. The most common semiconductor materials include silicon, germanium, gallium arsenide, etc. The silicon is the most common and is used in the widespread commercial applications.

Virtually all aspects of our lives are touched by semiconductor products. For example, Light-Emitting Diode (LED) and Laser Diode (LD) have been applied to illumination, indicator light sources, optical information storage system, laser printer, optical fiber communication and medical field, etc. Other products such as light detectors, solar cells, optical amplifier, transistor, etc. have an enormous impact on our lives in this high tech age. The display quality is particularly important in the era of video communication.

The display has become an essential means in human-computer interaction along with the advanced technology and the prevalence of personal computer, internet use and information & communication technology. The rapidly developing display technology is further booming the flat-panel display industry.

A conventional Cathode Ray Tube (CRT) screen is bulky and heavy for users. Thus the CRT screen has been gradually replaced by a thinner and larger sized Plasma Display Panel (PDP) and much thinner and lighter Liquid Crystal Display (LCD).

OLED (Organic Light Emitting Diodes), also called organic electroluminescence (OEL), is an offshoot of the next generation of flat panel display technology. Besides compactness, OLED displays have unique advantages including flexibility, portability, full color capability and high brightness, low power consumption, wide viewing angle, no image sticking, etc. Thus the OLED has become a mainstream in the flat panel display industry. Experts in universities and their industrial partners are dedicated to research and development of this new technology.

Under the influence of a voltage applied to OLED, holes and electrons are injected into the hole injection layer and the electron injection layer, and passed through the hole transport layer and the electron transport layer respectively. Then the holes and electrons enter the light emitting layer and recombine to form excitons that relax to the ground state by release of energy. The energy is released as light due to relaxation of excitons in the singlet or triplet state to the ground state. Owing to the light emitting material used and spin state characteristics of the electrons, only 25% of the energy released (from singlet to the ground state) is used as OLED luminescence while the rest 75% (from triplet to the ground state) is released in the form of phosphorescence or heat. The frequency of the radiation depends on the band gap of the material used so that the color of the light produced can be varied.

The principles of OLED are similar to those of LED (light emitting diode). The difference between OLED and LED is that OLED uses organic compounds as materials that emit light and the light emission of OLED is more efficient with most of the photons generated across the visible light spectrum.

Moreover, as OELD is self-emitting, no backlight is required. Thus the OLED has optimum visibility and high brightness. The OLED features on low driving-voltage, high efficiency, fast response, light weight, slim profile, etc. Compared with LCD, OLED has no image retention and having a wide temperature range. OLED's response time at low temperature is the same as that at room temperature while the temperature affects LCD. A longer response time is required at low temperature and liquid crystals can even freeze and cause performance problems.

However, certain problems occur during production processes of semiconductor products (such as OLED). Under high vacuum, raw materials are heated and evaporated into atoms or molecules by current, electron beam irradiation, and laser and then to be deposited on a substrate required evenly. A metal mask is required during vacuum evaporation. The method is difficult to scale because that highly accurate positioning of the metal mask is required and larger metal masks are easy to lose accuracy. Thus the substrate used is limited to small scale one, difficult to scale up and unable to be mass produced. The cost of the metal mask is extremely high and a cleaning process is required during production of the metal mask. The positioning of the metal mask should be very accurate.

Furthermore, a lot of LOED materials are wasted during the vacuum evaporation. The vacuum evaporation is simple but inefficient because only 10-40% material reaches the substrate after the process. The OLED has low material utilization.

Thus there is room for improvement and there is a need to provide a novel OLED for solving problems that occurs during conventional vacuum evaporation (such as difficulty in mass production of large-scale products and low material efficiency).

SUMMARY OF THE INVENTION

Therefore it is a primary object of the present invention to provide a method for continuously preparing organic light emitting diode (OLED) by using thermal transfer film in which at least two transfer layers on the thermal transfer film are heated and transferred onto a substrate in turn by thermal transfer printing for solving problems of complicated processes and low material efficiency of the conventional vacuum evaporation. Only less than 50% material reaches the substrate after the vacuum evaporation.

In order to achieve the above object, a method for preparing organic light emitting diode (OLED) by using thermal transfer film according to the present invention includes the following steps. First take a first thermal transfer film and a second thermal transfer film while the first thermal transfer film includes a first heat resistant layer, a first base layer, a first functional layer and first transfer layer from top to bottom in turn and the second thermal transfer film includes a second heat resistant layer, a second base layer, a second functional layer and a second transfer layer from top to bottom in turn. Then take a substrate and set the substrate under the first thermal transfer film. Heat the first thermal transfer film for transferring the first transfer layer onto the substrate. Next move the substrate to be under the second thermal transfer film. Later heat the second thermal transfer film for transferring the second transfer layer onto the first transfer layer over the substrate.

The step of taking a first thermal transfer film and a second thermal transfer film further includes the steps of: coating a heat resistant layer solution on a first surface of a first base layer to form a first heat resistant layer, coating a functional layer solution on a second surface of the first base layer to form a first functional layer and a third surface of the first functional layer being located over the second surface, performing a disposition process by which a first transfer layer is set on a fourth surface of the first functional layer, and forming a first thermal transfer film.

The step of taking a first thermal transfer film and a second thermal transfer film further includes the steps of: coating a heat resistant layer solution on a first surface of a second base layer to form a second heat resistant layer, coating a functional layer solution on a second surface of the second base layer to form a second functional layer and a third surface of the second functional layer being located over the second surface, performing a disposition process by which a second transfer layer is set on a fourth surface of the second functional layer, and forming a second thermal transfer film.

The first thermal transfer film and the second transfer film are connected.

Both the first heat resistant layer 20 and the second heat resistant layer 20' are composed of zinc stearate (SPZ-100F), zinc stearyl phosphate (LBT-1830) and cellulose acetate propionate (CAP-504-0.2).

The thickness of the first heat resistant layer and the second heat resistant layer is ranging from 0.1 um to 3 um.

The first base layer and the second base layer are made from a material selected from the group consisting of polyethylene terephthalate (PET), Polyimide (PI), poly(ethylene naphthalate) (PEN) and a combination thereof.

The thickness of both the base layer and the second base layer is ranging from 2 um to 100 um.

The first functional layer and the second functional layer are made from a material selected from the group consisting of silver, aluminum, magnesium, and a combination thereof.

The first functional layer and the second functional layer are made from a material selected from the group consisting of trimethylolpropane triacrylate (TMPTA), polyvinyl butyral (PVB), pentaerythritol tetranitrate (PETN), trinitrotoluene (TNT), acrylic resin, epoxy resin, cellulose resin, PVB resin, polyvinyl chloride (PVC) resin and a combination thereof.

The thickness of the first functional layer and the second functional layer is ranging from 0.3 um to 10 um.

The first transfer layer and the second transfer layer are made from a material selected from the group consisting of a hole injection material, a hole transport material, a RGB light emitting material, an electron transport material, an electron injection material, a metallic nanomaterial, a carbon nanotube conductive material and a combination thereof.

The first transfer layer and the second transfer layer are made from a material selected from the group consisting of an arylamine, a polymer mixture of ionomers, a P-dopant, a phenyl arylamine, an organic fluorescent material, an organic phosphorescent material, a thermally-activated delayed fluorescence (TADF) material, a heavy metal complex, an organic polycyclic aromatics, a polycyclic aromatic hydrocarbon (PAH), a blue emitting material, a green emitting material, a red emitting material, a heterocyclic compound, an oxadiazole derivative, a metal chelate, an azole-based derivative, a quinolone derivative, a quinoxaline derivative, an anthrazoline derivative, a phenanthroline derivative, a silole derivative, a fluorobezene derivative, a N-dopant, a metal, an alloy, a metal complex, a metal compound, a metal oxide, an electroluminescent material, an electroactive material, and a combination thereof.

The thickness of the first transfer layer and the second transfer layer is ranging from 20 nm to 200 nm.

The disposition process for arranging the first transfer layer and the second transfer layer is selected from the group consisting of vacuum evaporation, spin coating, slot die coating, inkjet printing, gravure printing, screen printing, chemical vapor deposition (CVD), physical vapor deposition (PVD), and sputtering.

The first transfer layer and the second transfer layer are selected from adjacent combinations of the group consisting of an anode, a hole injection layer, a hole transport layer, a light emitting layer, an electron transport layer, an electron injection layer, and a cathode.

The substrate is made from a material selected from the group consisting of glass, polyimide (PI), polyethylene terephthalate (PET) and a combination thereof.

In the step of heating the first thermal transfer film for transferring the first transfer layer onto the substrate and the step of heating the second thermal transfer film for transferring the second transfer layer onto the first transfer layer over the substrate, a thermal print head (TPH) is used to heat the first thermal transfer film and the second thermal transfer film.

In the step of heating the first thermal transfer film for transferring the first transfer layer onto the substrate and the step of heating the second thermal transfer film for transferring the second transfer layer onto the first transfer layer over the substrate, the first thermal transfer film and the second thermal transfer film are heated up to 80-300 degrees Celsius (° C.).

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

Figure 1:
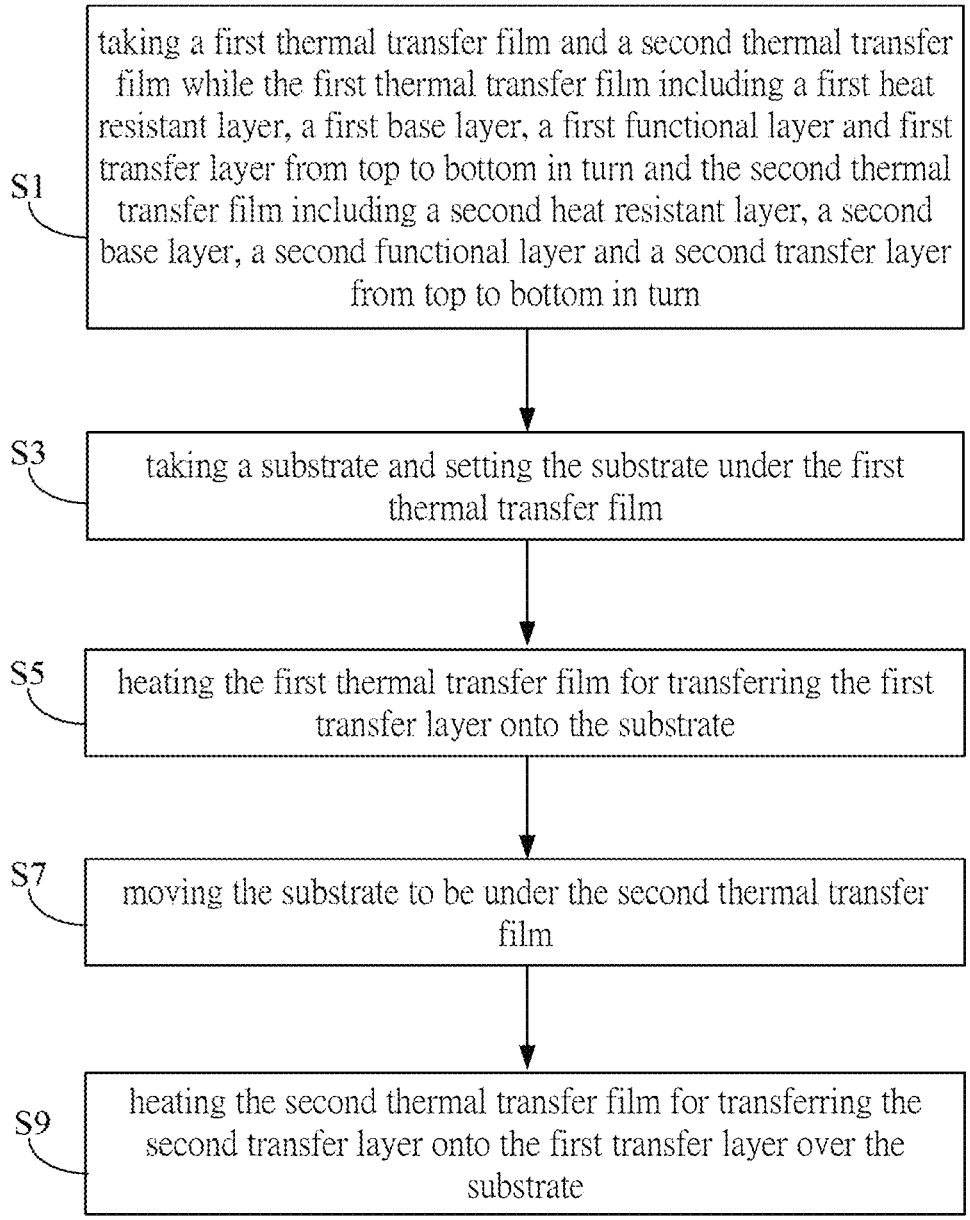
FIG. 1 is a flow chart showing steps of an embodiment according to the present invention.

In order to learn features and functions of the present invention, please refer to the following embodiments and the related descriptions.

In order to solve problems of the conventional vacuum evaporation used for preparing organic light emitting diode (OLED) (such as difficult scale-up and low material efficiency) that cause high production cost, a method for continuously preparing OLED by using thermal transfer film according to the present invention is provided.

The features, the structure of the method for continuously preparing OLED by using thermal transfer film according to the present invention are revealed by the following embodiments.

Refer to FIG. 1 and FIG. 2A-2E, a method for continuously preparing organic light emitting diode (OLED) by using thermal transfer film according to the present invention includes the following steps.

S1: taking a first thermal transfer film and a second thermal transfer film while the first thermal transfer film including a first heat resistant layer, a first base layer, a first functional layer and first transfer layer from top to bottom in turn and the second thermal transfer film including a second heat resistant layer, a second base layer, a second functional layer and a second transfer layer from top to bottom in turn;

S3: taking a substrate and setting the substrate under the first thermal transfer film;

S5: heating the first thermal transfer film for transferring the first transfer layer onto the substrate;

S7: moving the substrate to be under the second thermal transfer film;

S9: heating the second thermal transfer film for transferring the second transfer layer onto the first transfer layer over the substrate.

Refer to FIG. 2 and the step S1, taking a first thermal transfer film 1 and a second thermal transfer film 1'. The first thermal transfer film 1 includes a first heat resistant layer 20, a first base layer 10, a first functional layer 30 and first transfer layer 40 from top to bottom in turn. The second thermal transfer film 1' consists of a second heat resistant layer 20', a second base layer 10', a second functional layer 30' and a second transfer layer 40' from top to bottom in turn.

Figure 3A:
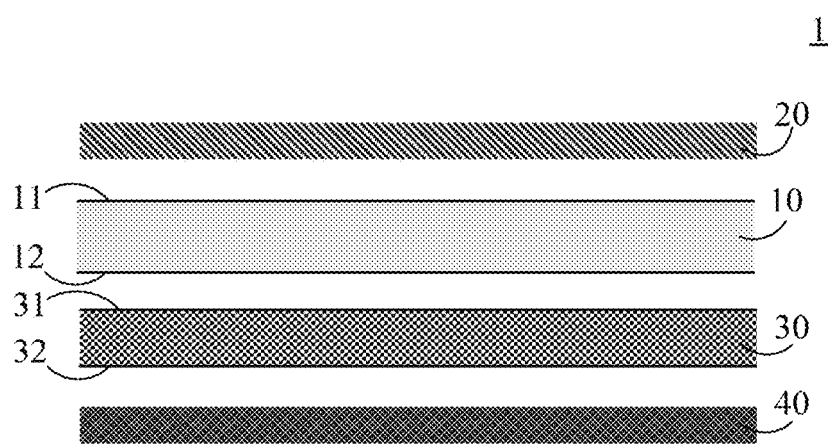
FIG. 3A is a schematic drawing showing structure of a first thermal transfer film of an embodiment according to the present invention.
Figure 3B:
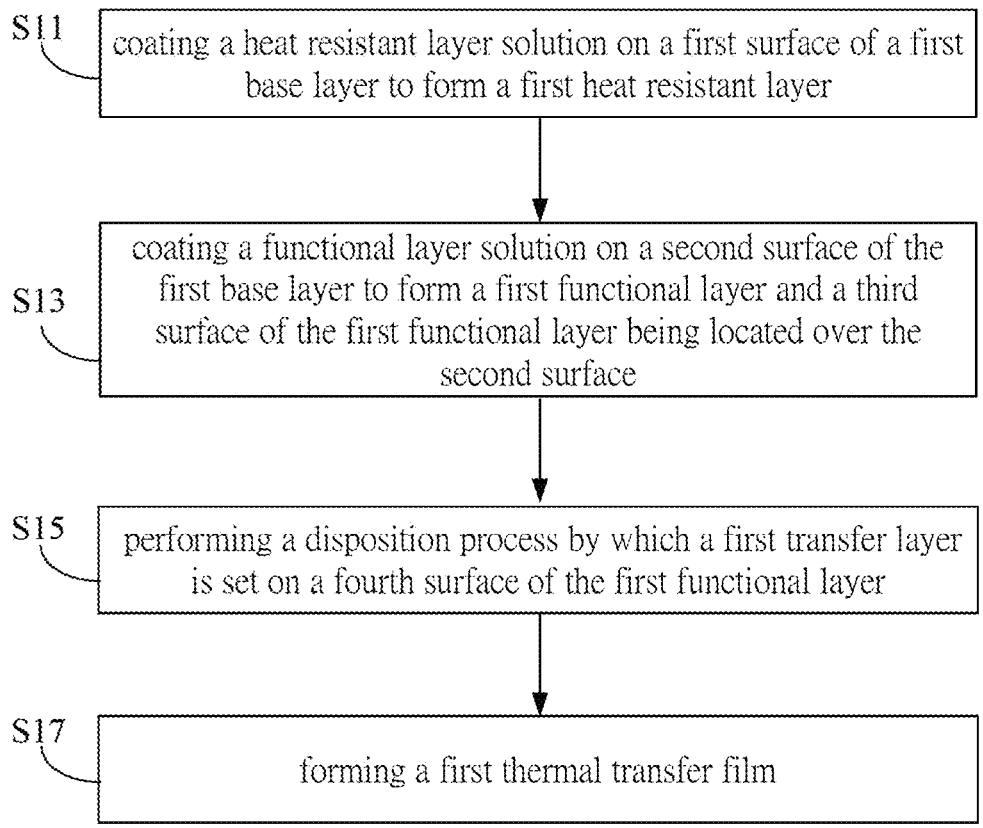
FIG. 3B is a flow chart showing steps for preparation of a first thermal transfer film of an embodiment according to the present invention.

Refer to FIG. 3A and FIG. 3B, a schematic drawing showing structure of a first thermal transfer film and a flow chart showing steps for preparing a first thermal transfer film are disclosed. The step S1 further includes the following steps.

S11: coating a heat resistant layer solution on a first surface of a first base layer to form a first heat resistant layer;

S13: coating a functional layer solution on a second surface of the first base layer to form a first functional layer and a third surface of the first functional layer being located over the second surface;

S15: performing a disposition process by which a first transfer layer is set on a fourth surface of the first functional layer; and S17: forming a first thermal transfer film.

Figure 4A:
FIG. 4A is a schematic drawing showing structure of a second thermal transfer film of an embodiment according to the present invention.
Figure 4B:
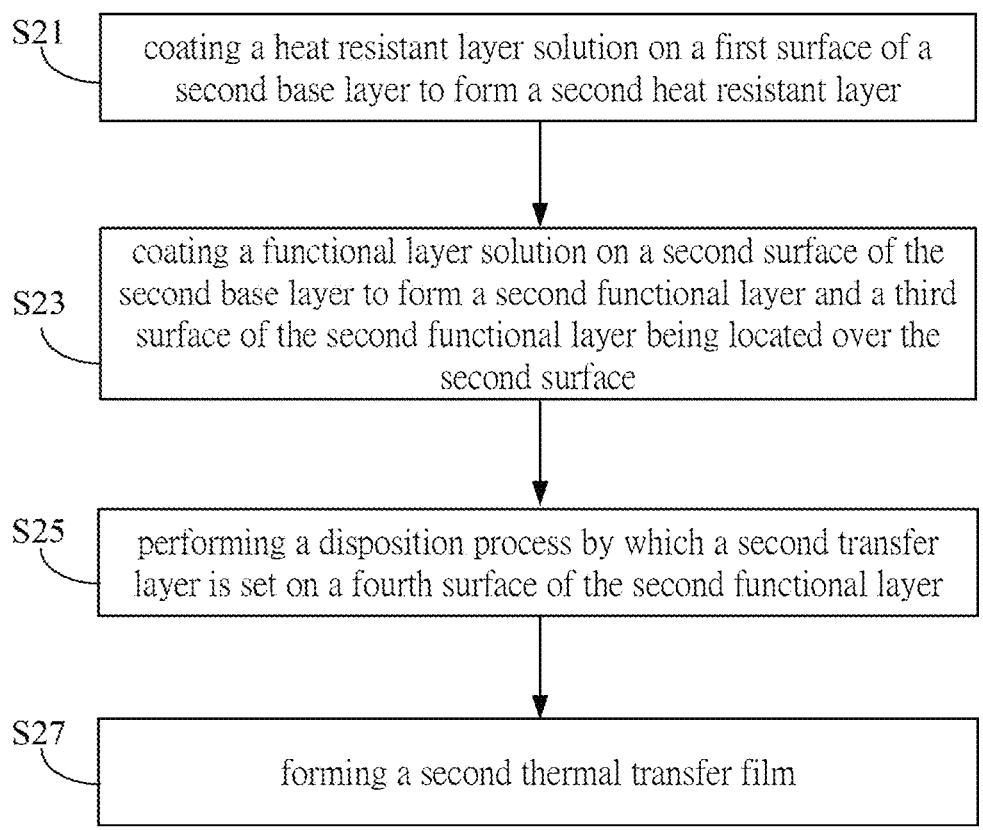
FIG. 4B is a flow chart showing steps for preparing a second thermal transfer film of an embodiment according to the present invention.

Refer to FIG. 4A and FIG. 4B, a schematic drawing showing structure of a second thermal transfer film and a flow chart showing steps for preparing a second thermal transfer film are disclosed. The step S1 further includes the following steps.

S21: coating a heat resistant layer solution on a first surface of a second base layer to form a second heat resistant layer;

S23: coating a functional layer solution on a second surface of the second base layer to form a second functional layer and a third surface of the second functional layer being located over the second surface;

S25: performing a disposition process by which a second transfer layer is set on a fourth surface of the second functional layer; and S27: forming a second thermal transfer film.

Both the first heat resistant layer 20 and the second heat resistant layer 20' are composed of zinc stearate (SPZ-100F), zinc stearyl phosphate (LBT-1830) and cellulose acetate propionate (CAP-504-0.2). The thickness of the first heat resistant layer 20 and the second heat resistant layer 20' is ranging from 0.1 um to 3 um.

The heat resistant layer solution in the step S11 and the step S21 is prepared as follows. Take 60.2 g butanone (MEK), 25.8 g toluene, 1.6 g zinc stearate (SPZ-100F), 1 g zinc stearyl phosphate (LBT-1830), 0.5 g nano modified clay (C34-M30), 0.2 g paint additive (KP-341), 0.2 g anionic surfactant (KC-918), 10 g cellulose acetate propionate (CAP-504-0.2) and 0.25 g dispersant (BYK103) to form a first solution. Then stir the first solution for 2 hours for dissolving all of the solutes completely.

Then take 3 g fatty alcohol polyoxyethylene ether (AEO) (L75) and 3 g butanone (MEK) to form a second solution. Lastly mix the first solution and the second solution to get the heat resistant layer solution.

Next use the rotogravure printing machine (Hsing Wei Machine Industry Co., Ltd.) with different mesh count including 135, 150 and 250 to print the heat resistant layer solution on a first surface 11 of the first base layer 10 and a first surface 11' of the second base layer 10' respectively. Then the base layer 10 and the second base layer 10' are heated in an oven at 50~120° C. for 1~10 min.

The first base layer 10 and the second base layer 10' are made from a material selected from the group consisting of polyethylene terephthalate (PET), Polyimide (PI), poly(ethylene naphthalate) (PEN) and a combination thereof. The thickness of both the base layer 10 and the second base layer 10' is ranging from 2 um to 100 um.

The first functional layer 30 and the second functional layer 30' are made from a material selected from the group consisting of silver, aluminum, magnesium, and a combination thereof.

The first functional layer 30 and the second functional layer 30' are made from a materials selected from the group consisting of trimethylolpropane triacrylate (TMPTA), polyvinyl butyral (PVB), pentaerythritol tetranitrate (PETN), trinitrotoluene (TNT), acrylic resin, epoxy resin, cellulose resin, PVB resin, polyvinyl chloride (PVC) resin and a combination thereof.

The functional layer solution in the step S13 and the step S23 is prepared as follows. Dissolve 14.85 g trimethylolpropane triacrylate (TMPTA), 0.93 g polyvinyl butyral, 2.78 g waterborne resin (Joncry 671) in 10 g 1-methoxy-2-propanol and 10 g butanone (MEK) to form a third solution. Dissolve 1.25 g UV curing agent (Irgacure 369) in 5 g butanone (MEK) to form a fourth solution. Dissolve 0.19 g photoinitiator (Irgacure 184) in 2.5 g butanone (MEK) to form a fifth solution.

Then mix 5 g the third solution, 0.81 g the fourth solution and 0.352 g the fifth solution to form a formulated solution. Lastly use butanone (MEK) as solvent to dilute the formulated solution to the dissolved solid content required.

Next use the electric gravure coating machine (K Printing Proofer of RK printcoat instruments) with different mesh count such as 135 or 250 to print the functional layer solution on a second surface 12 of the first base layer 10 and a second surface 12 of the second base layer 10'. Then the first base layer 10 and the second base layer 10' are heated in an oven at 30~140° C. for 1~30 min and later cured by UV radiation so as to form the first functional resistant layer 30 and the second functional resistant layer 30'. A third surface 31 of the first functional resistant layer 30 is located over the second surface 12 while a third surface 31' of the second functional resistant layer 30' is located over the second surface 12'. The thickness of first functional resistant layer 30 and the second functional resistant layer 30' is ranging from 0.3 um to 10 um.

The first transfer layer 40 and the second transfer layer 40' are made from a material selected from the group consisting of a hole injection material, a hole transport material, a RGB light emitting material, an electron transport material, an electron injection material, a metallic nanomaterial, a carbon nanotube conductive material and a combination thereof.

The thickness of the first transfer layer 40 and the second transfer layer 40' is ranging from 20 nm to 200 nm. The first transfer layer 40 and the second transfer layer 40' are selected from adjacent combinations of the group consisting of an anode, a hole injection layer, a hole transport layer, a light emitting layer, an electron transport layer, an electron injection layer, and a cathode.

The anode and the cathode are generally made from conductive materials such as a metal, an alloy, a metal compound, a metal oxide, an electroactive material, a conductive dispersion and a conductive polymer. For example, the materials include gold, platinum, palladium, aluminum, calcium, titanium, titanium nitride (TiN), indium tin oxide (ITO), fluorine-doped tin oxide (FTO), polyaniline, etc.

The hole injection layer is made from a material selected from the group consisting of an arylamine, a polymer mixture of ionomers (such as PEDOT:PSS), a P-dopant and a combination thereof.

The hole transport layer is made from a material selected from the group consisting of an arylamine, a phenyl arylamine and a combination thereof.

The light emitting layer is made from a material selected from the group consisting of an organic fluorescent material, an organic phosphorescent material, a thermally-activated delayed fluorescence (TADF) material, a heavy metal complex (such as iridium, platinum, silver, osmium, lead, etc.), an organic polycyclic aromatic, a polycyclic aromatic hydrocarbon (PAH), a blue emitting material, a green emitting material, a red emitting material, an electroluminescent material and a combination thereof.

The electron transport layer is made from a material selected from the group consisting of a heterocyclic compound, an oxadiazole derivative, a metal chelate, an azole-based derivative, a quinolone derivative, a quinoxaline derivative, an anthrazoline derivative, a phenanthroline derivative, a silole derivative, a fluorobezene derivative and a combination thereof.

The electron injection layer is made from a material selected from the group consisting of an N-dopant, a metal complex and a metal compound (such as an alkali metal compound, an alkaline earth metal compound, etc.), and a combination thereof.

In the step S15 and the step S25, the disposition process for arranging the first transfer layer 40 and the second transfer layer 40' is selected from the group consisting of vacuum evaporation, spin coating, slot die coating, inkjet printing, gravure printing, screen printing, chemical vapor deposition (CVD), physical vapor deposition (PVD), and sputtering. The first transfer layer 40 and the second transfer layer 40' are arranged at a fourth surface 32 of the first functional layer 30 and a fourth surface 32' of the second functional layer 30' respectively.

Figure 2A:
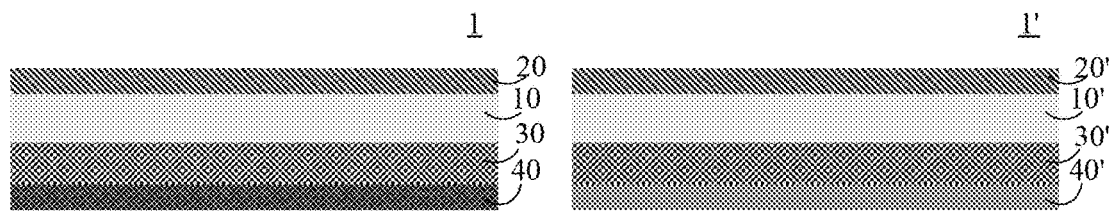
FIG. 2A-2E are schematic drawings each of which shows the respective step of an embodiment according to the present invention.
Figure 2B:
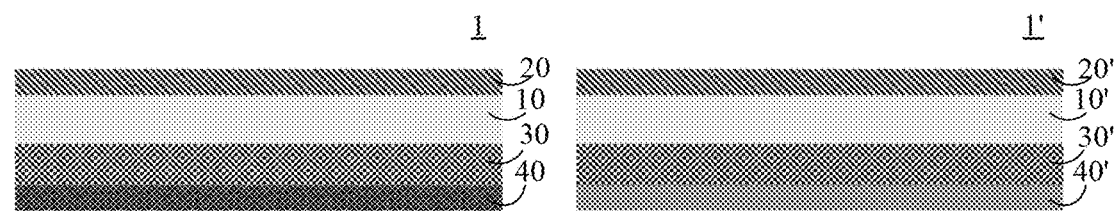
Figure 2B:
Figure 2C:
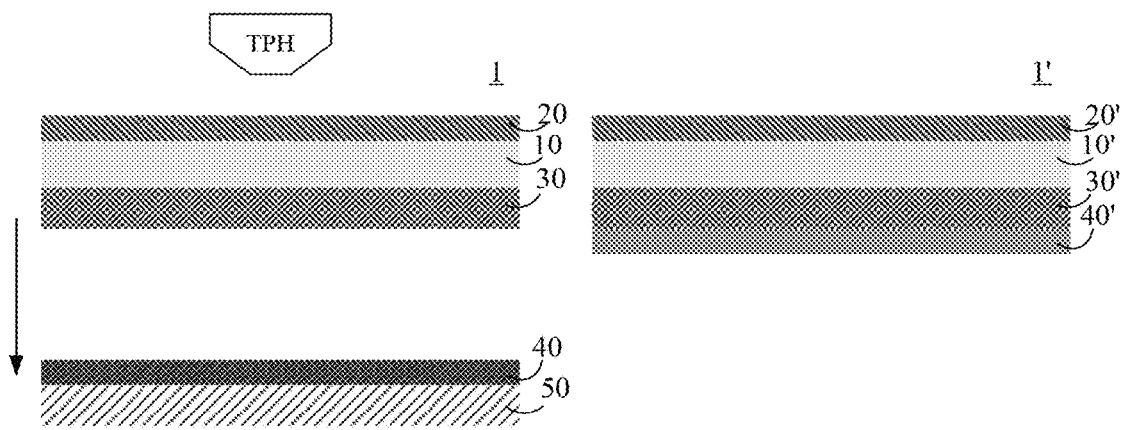

Refer to the step S3 and the FIG. 2B, taking a substrate 50 and setting the substrate 50 under the first thermal transfer film 1.

The substrate is made from a material selected from the group consisting of glass, polyimide (PI), polyethylene terephthalate (PET) and a combination thereof.

As shown in the step SSand the FIG. 2 C, heating the first thermal transfer film 1 for transferring the first transfer layer 40 onto the substrate 50 and removing the first heat resistant layer 20, the first base layer 10 and the first functional layer 30. In the step S5, a thermal print head (TPH) is used to heat the first thermal transfer film 1 up to 80-300 degrees Celsius (° C.). The first heat resistant layer 20, the first base layer 10, and the first functional layer 30 are removed after the thermal transfer printing.

Figure 2D:
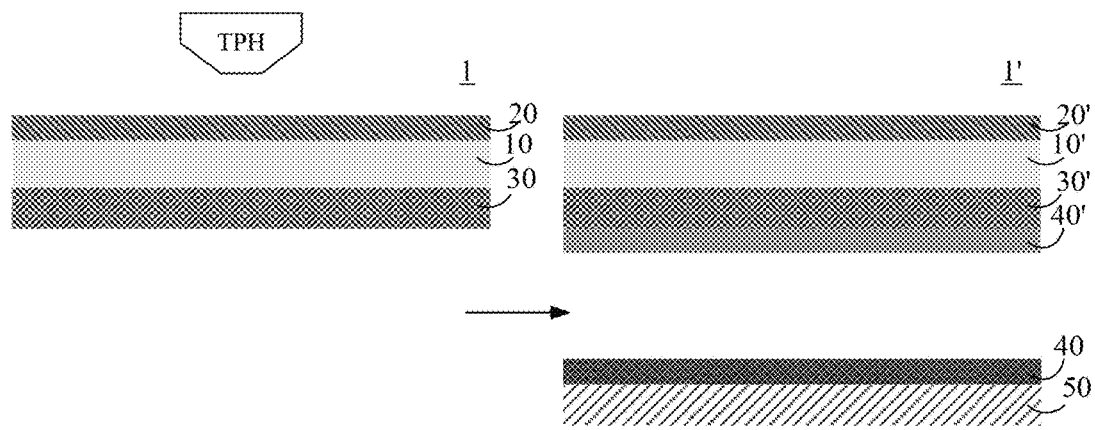

Refer to the step S7 and the FIG. 2D, moving the substrate 50 to be under the second thermal transfer film 1'.

Figure 2E:
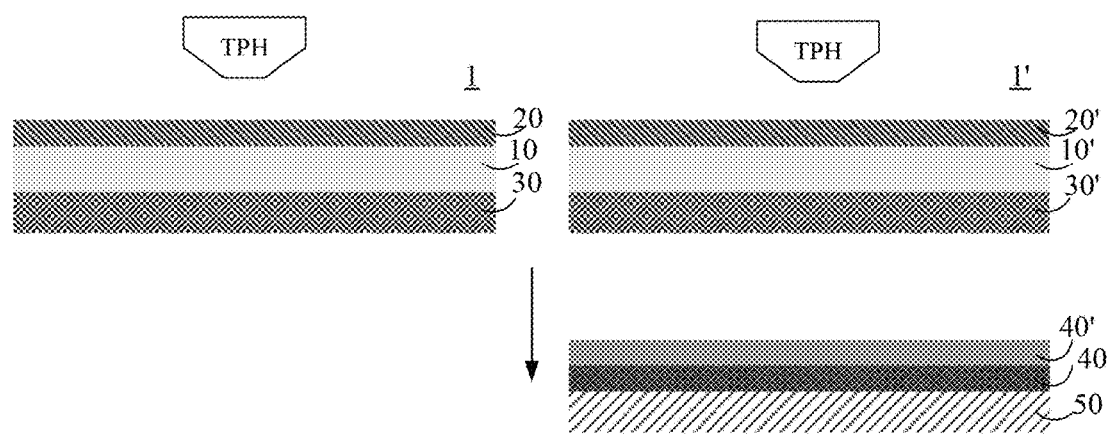

Next as shown in the step S9 and the FIG. 2E, heating the second thermal transfer film 1' for transferring the second transfer layer 40' onto the first transfer layer 40 over the substrate 50 and removing the second heat resistant layer 20', the first base layer 10' and the first functional layer 30'. In the step S9, a thermal print head (TPH) is used to heat the second thermal transfer film 1' up to 80-300 degrees Celsius (tC). The second heat resistant layer 20', the second base layer 10', and the second functional layer 30' are removed after the thermal transfer printing.

Lastly keep performing thermal transfer printing until the an anode, the hole injection layer, the hole transport layer, the light emitting layer, the electron transport layer, the electron injection layer, and the cathode are stacked on the substrate 50 in turn. Thus an organic light emitting diode (OLED) is formed.

Figure 5:
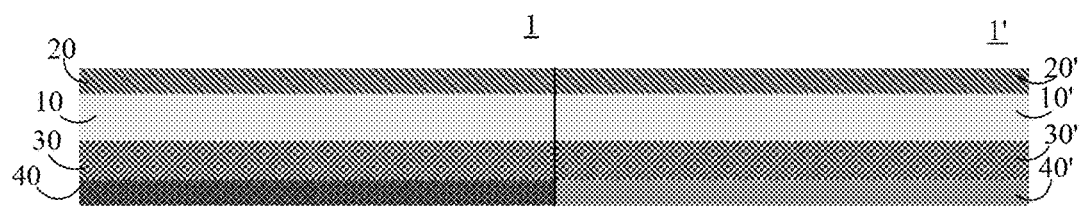
FIG. 5 is a schematic drawing showing structure of another embodiment according to the present invention.

Refer to FIG. 5, another embodiment is revealed. As shown in figure, the first thermal transfer film 1 and the second thermal transfer film 1' are connected and heated by the thermal print head (TPH) on a conveyor belt for transferring the first transfer layer 40 and the second transfer layer 40' onto the substrate 50.

Figure 6A:
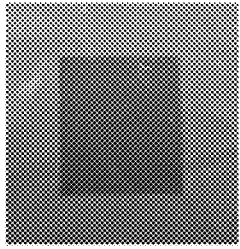
FIG. 6A-6B are schematic drawings showing test results of an embodiment using green emitting material respectively according to the present invention.
Figure 6B:
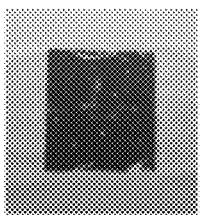

Refer to FIG. 6A and FIG. 6B, schematic drawings showing structure of an embodiment using green emitting material is revealed. In the first transfer layer 40 of the first thermal transfer film 1 (the donor film 1), 4,4',4"-Tris (carbazol-9-yl)-triphenylamine (TCTA) is used as the hole transport layer (with the thickness of about 400 Å) and is disposed on the first functional layer 30. Then the first functional layer 30 is heated and transferred onto the glass substrate 50 (Sub). The substrate 50 has already been provided with indium tin oxide (ITO) by vacuum evaporation in advance and the ITO is used as the anode. Then PEDOT:PSS(Poly-(3,4-ethylenedioxythiophene)-poly(styrenesulfonate)) is coated by spin coating and used as the electron injection layer. The TPH is used to heat and transfer and the result is shown in FIG. 6A. The thickness (THK) of TCTA is 446.4 Å and the transfer ratio is higher than 99% after repeating the experiments. Then perform transferring continuously. The second transfer layer 40' of the second thermal transfer film 1' (the donor film 1') is a two-layer transfer layer. 1,3,5-Tris(1-phenyl-1H-benzimidazol-2-yl)benzene (TPBI) is used as the electron transfer layer and CBP Ir(ppy)$_3$(4,4'-Bis(carbazol-9-yl)biphenyl:Tris(2-phenylpyridine)iridium-(III))(thickness about 500 Å) is used as the light emitting layer, both arranged at the second functional layer 30'. Next the TPH is used to heat and transfer the electron transfer layer and the light emitting layer onto the first transfer layer 40 (TCTA). After the transferring, lithium fluoride (LiF) used as the electron injection layer and aluminum (Al) used as cathode are disposed on TPBI by vapor deposition to form the organic light emitting diode. As shown in FIG. 6B, the THK of TCTA/CBP:Ir(ppy)$_3$/TPBI is 1383 Å and the transfer ratio is higher than 99% after repeating the experiments. Besides the hole transfer layer, the light emitting layer and the electron transfer layer being arranged by thermal heat printing, the respective layer of the OLED (such as the anode, the hole injection layer, the electron injection layer and the cathode, etc.) can be transferred onto the substrate 50 by thermal transfer printing.

Figure 6C:
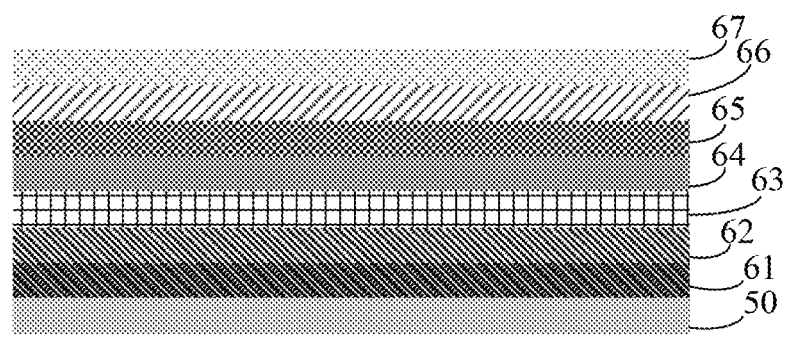
FIG. 6C is a schematic drawing showing structure of an embodiment using green emitting material according to the present invention.

Refer to FIG. 6C, indium tin oxide (ITO) 61, PEDOT:PSS 62, 4,4',4''-Tris(carbazol-9-yl)-triphenylamine (TCTA) 63, CBP:Ir(ppy)$_3$ 64, 1,3,5-Tris(1-phenyl-1H-benzimidazol-2-yl)benzene 65, lithium fluoride (LiF) 66 and aluminum 67 are stacked over the substrate 50 in turn.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalent.

What is claimed is:

1. A method for continuously preparing an organic light emitting diode (OLED) by using a thermal transfer film comprising the steps of:
    taking a first thermal transfer film and a second thermal transfer film, the first thermal transfer film including a first heat resistant layer, a first base layer, a first functional layer and first transfer layer from top to bottom and the second thermal transfer film having a second heat resistant layer, a second base layer, a second functional layer and a second transfer layer from top to bottom;
    taking a substrate and setting the substrate under the first thermal transfer film;
    heating the first thermal transfer film for transferring the first transfer layer onto the substrate;
    moving the substrate to be under the second thermal transfer film; and
    heating the second thermal transfer film for transferring the second transfer layer onto the first transfer layer over the substrate.

2. The method as claimed in claim 1, wherein the step of taking the first thermal transfer film and the second thermal transfer film further includes the steps of:
    coating a heat resistant layer solution on a first surface of the first base layer to form the first heat resistant layer;
    coating a functional layer solution on a second surface of the first base layer to form the first functional layer and a third surface of the first functional layer being located over the second surface;
    performing a disposition process by which the first transfer layer is set on a fourth surface of the first functional layer; and
    forming the first thermal transfer film.

3. The method as claimed in claim 2, wherein the disposition process is selected from the group consisting of vacuum evaporation, spin coating, slot die coating, inkjet printing, gravure printing, screen printing, chemical vapor deposition (CVD), physical vapor deposition (PVD), and sputtering.

4. The method as claimed in claim 1, wherein the step of taking the first thermal transfer film and the second thermal transfer film further includes the steps of:
    coating a heat resistant layer solution on a first surface of the second base layer to form the second heat resistant layer;
    coating a functional layer solution on a second surface of the second base layer to form the second functional layer and a third surface of the second functional layer being located over the second surface; and
    performing a disposition process by which the second transfer layer is set on a fourth surface of the second functional layer; and
    forming the second thermal transfer film.

5. The method as claimed in claim 4, wherein the disposition process is selected from the group consisting of vacuum evaporation, spin coating, slot die coating, inkjet printing, gravure printing, screen printing, chemical vapor deposition (CVD), physical vapor deposition (PVD), and sputtering.

6. The method as claimed in claim 1, wherein the first thermal transfer film and the second transfer film are connected.

7. The method as claimed in claim 1, wherein both the first heat resistant layer and the second heat resistant layer are composed of zinc stearate, zinc stearyl phosphate and cellulose acetate propionate.

8. The method as claimed in claim 1, wherein a thickness of the first heat resistant layer and the second heat resistant layer is ranging from 0.1 um to 3 um.

9. The method as claimed in claim 1, wherein the first base layer and the second base layer are made from a material selected from the group consisting of polyethylene terephthalate (PET), Polyimide (PI), poly(ethylene naphthalate) (PEN) and a combination thereof.

10. The method as claimed in claim 1, wherein a thickness of both the first base layer and the second base layer is ranging from 2 um to 100 um.

11. The method as claimed in claim 1, wherein the first functional layer and the second functional layer are made from a material selected from the group consisting of silver, aluminum, magnesium, and a combination thereof.

12. The method as claimed in claim 1, wherein the first functional layer and the second functional layer are made from a material selected from the group consisting of trimethylolpropane triacrylate (TMPTA), polyvinyl butyral (PVB), pentaerythritol tetranitrate (PETN), trinitrotoluene (TNT), acrylic resin, epoxy resin, cellulose resin, PVB resin, polyvinyl chloride (PVC) resin and a combination thereof.

13. The method as claimed in claim 1, wherein a thickness of the first functional layer and the second functional layer is ranging from 0.3 um to 10 um.

14. The method as claimed in claim 1, wherein the first transfer layer and the second transfer layer are made from a material selected from the group consisting of a hole injection material, a hole transport material, a RGB light emitting material, an electron transport material, an electron injection material, a metallic nanomaterial, a carbon nanotube conductive material and a combination thereof.

15. The method as claimed in claim 1, wherein the first transfer layer and the second transfer layer are made from a material selected from the group consisting of an arylamine, a polymer mixture of ionomers, a P-dopant, a phenyl arylamine, an organic fluorescent material, an organic phosphorescent material, a thermally-activated delayed fluorescence (TADF) material, a heavy metal complex, an organic polycyclic aromatics, a polycyclic aromatic hydrocarbon (PAH), a blue emitting material, a green emitting material, a red emitting material, a heterocyclic compound, an oxadiazole derivative, a metal chelate, an azole-based derivative, a quinolone derivative, a quinoxaline derivative, an anthrazoline derivative, a phenanthroline derivative, a silole derivative, a fluorobezene derivative, a N-dopant, a metal, an alloy, a metal complex, a metal compound, a metal oxide, an electroluminescent material, an electroactive material, and a combination thereof.

16. The method as claimed in claim 1, wherein a thickness of the first transfer layer and the second transfer layer is ranging from 20 nm to 200 nm.

17. The method as claimed in claim 1, wherein the first transfer layer and the second transfer layer are selected from adjacent combinations of the group consisting of an anode, a hole injection layer, a hole transport layer, a light emitting layer, an electron transport layer, an electron injection layer, and a cathode.

18. The method as claimed in claim 1, wherein the substrate is made from a material selected from the group consisting of glass, polyimide (PI), polyethylene terephthalate (PET) and a combination thereof.

19. The method as claimed in claim 1, wherein a thermal print head (TPH) is used to heat the first thermal transfer film and the second thermal transfer film in the step of heating the first thermal transfer film for transferring the first transfer layer onto the substrate and the step of heating the second thermal transfer film for transferring the second transfer layer onto the first transfer layer over the substrate.

20. The method as claimed in claim 1, wherein the first thermal transfer film and the second thermal transfer film are heated up to 80-300 degrees Celsius (° C.) in the step of heating the first thermal transfer film for transferring the first transfer layer onto the substrate and the step of heating the second thermal transfer film for transferring the second transfer layer onto the first transfer layer over the substrate.

* * * * *